(12) United States Patent
Krishnamoorthy et al.

(10) Patent No.: US 9,049,057 B2
(45) Date of Patent: Jun. 2, 2015

(54) DUTY CYCLE COMPENSATION OF RAM TRANSMITTERS

(75) Inventors: Satish Krishnamoorthy, Folsom, CA (US); Harishankar Sridharan, Fremont, CA (US); Ritesh B. Trivedi, Folsom, CA (US); Senthilkumar Ganapathy, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 224 days.

(21) Appl. No.: 13/536,567

(22) Filed: Jun. 28, 2012

(65) Prior Publication Data
US 2014/0003550 A1    Jan. 2, 2014

(51) Int. Cl.
| | |
|---|---|
| *G11C 7/00* | (2006.01) |
| *H04L 27/00* | (2006.01) |
| *H04L 25/03* | (2006.01) |
| *G11C 7/22* | (2006.01) |

(52) U.S. Cl.
CPC ... *H04L 27/00* (2013.01); *G11C 7/22* (2013.01); *H04L 25/03343* (2013.01)

(58) Field of Classification Search
CPC ........................................................ G11C 7/22

USPC ................ 365/194, 189.01, 189.11, 189.011; 327/155, 166, 170, 149, 158, 165, 172, 327/141, 161; 375/296, 355
See application file for complete search history.

(56) References Cited

U.S. PATENT DOCUMENTS

| | | | |
|---|---|---|---|
| 7,667,507 B2* | 2/2010 | Neidengard | 327/155 |
| 2004/0140832 A1* | 7/2004 | Shiah | 327/170 |
| 2006/0001465 A1* | 1/2006 | Kwak et al. | 327/160 |
| 2007/0080730 A1* | 4/2007 | Hunter | 327/170 |

* cited by examiner

*Primary Examiner* — Richard Elms
*Assistant Examiner* — Mohammed A Bashar
(74) *Attorney, Agent, or Firm* — Schwabe, Williamson & Wyatt, P.C.

(57) ABSTRACT

Disclosed embodiments may include a circuit having a clock-to-output (TCO) compensation circuit coupled to a RAM pull-up transmitter and a RAM pull-down transmitter. The TCO compensation circuit may be configured to compare a first output with a second output and to generate a delay code, based on the comparison, for at least one other RAM transmitter on the die to adjust a duty cycle of a third output associated with the at least one other RAM transmitter. Other embodiments may be disclosed.

23 Claims, 5 Drawing Sheets

DUTY CYCLE COMPENSATION OF RAM TRANSMITTERS

TECHNICAL FIELD

Embodiments of the present disclosure relate generally to duty cycle compensation of random access memory (RAM) transmitters.

BACKGROUND INFORMATION

Memory controllers may communicate with memory through a variety of synchronous signals, such as clock signals, data signals, address signals, and control signals. The maximum speed of operation of the memory may depend on set-up and hold times of the clock, data, address, and/or control signals. Thus, the signal driving mechanism of the memory controller may affect overall performance of the memory that is driven by the memory controller.

BRIEF DESCRIPTION OF THE DRAWINGS

Embodiments of the invention are illustrated by way of example, and not by way of limitation, in the figures of the accompanying drawings in which like reference numerals refer to similar elements.

DESCRIPTION OF THE EMBODIMENTS

Embodiments of the present disclosure may relate to duty cycle compensation of random access memory (RAM) transmitter of an input/output (I/O) terminal of a memory controller. According to one embodiment, the RAM transmitter may include a clock-to-output (TCO) compensation circuit. The TCO compensation circuit may be configured to generate delay codes to adjust a duty cycle of the RAM transmitters of the memory controller. Advantageously, adjusting the duty cycle during power-on and periodically during operation enables the TCO compensation circuit to adjust duty cycle errors that may be caused by process variations and operational voltage and temperature changes.

Various aspects of the illustrative embodiments will be described using terms commonly employed by those skilled in the art to convey the substance of their work to others skilled in the art. It will be apparent to those skilled in the art, however, that some alternate embodiments may be practiced using portions of the described aspects. For purposes of explanation, specific numbers, materials, and configurations are set forth in order to provide a thorough understanding of the illustrative embodiments. It will be apparent to one skilled in the art, however, that alternate embodiments may be practiced without the specific details. In other instances, well-known features are omitted or simplified in order to not obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise. The phrase "A/B" means "A or B". The phrase "A and/or B" means "(A), (B), or (A and B)". The phrase "at least one of A, B and C" means "(A), (B), (C), (A and B), (A and C), (B and C) or (A, B and C)". The phrase "(A) B" means "(B) or (A B)", that is, A is optional.

Figure 1:
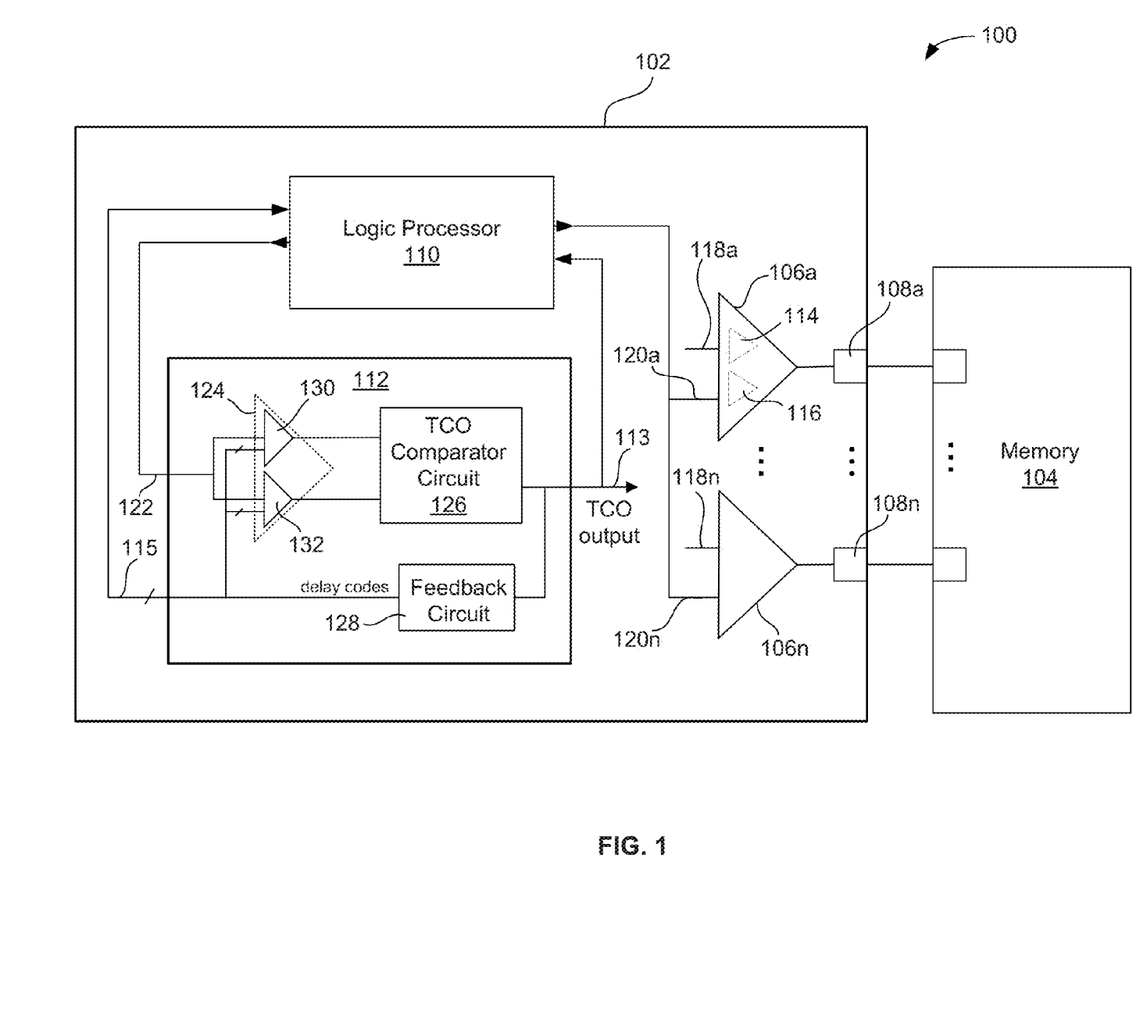
FIG. 1 describes a block diagram of a computing system including a memory controller, according to various embodiments of the present disclosure.

FIG. 1 illustrates a computing system 100 suitable for practicing embodiments of the present disclosure. Computing system 100 may include a memory controller 102 configured to transmit various synchronous signals to a memory 104.

Memory controller 102 may include random access memory (RAM) transmitters 106a to 106n (collectively, 106), terminals 108a to 108n (collectively, 108), a clock-to-output (TCO) logic processor 110, and a TCO compensation circuit 112.

RAM transmitters 106 may each be configured to transmit one of a number of output signals from memory controller 102 to memory module 104 through terminals 108. RAM transmitters 106 may transmit the output signals in response to input signals on input terminals 118a to 118n (collectively, 118). RAM transmitters may selectively delay rising and falling edges of the output signals in response to delay codes received on delay code terminals 120a to 120n (collectively, 120). According to various embodiments, the output signals may be clock signals, data signals, address signals, and/or command signals.

Each of RAM transmitters 106 may function similar to RAM transmitter 106a, so functionality of RAM transmitters 106 will be discussed in terms of RAM transmitter 106a, as an example.

RAM transmitter 106a may include a pull-up transmitter 114 and a pull-down transmitter 116. RAM transmitter 106a may transmit a rising-edge of an output signal to the terminal 108a by activating pull-up transmitter 114. RAM transmitter 106a may transmit a falling-edge of an output signal to terminal 108a by activating pull-down transmitter 116. Each of pull-up transmitter 114 and pull-down transmitter 116 include inherent delays in propagating information from input terminal 118a to terminal 108a.

The difference between inherent propagation delays of pull-up transmitter 114 and pull-down transmitter 116 may be compensated for through the use of delay codes. A rise-fall mismatch (RFMM) exists if pull-up transmitter 114 includes a propagation delay that is longer or shorter than a propagation delay of pull-down transmitter 116. RFMM may cause memory controller 102 to violate set-up and hold times while transferring data to memory 104. RFMM may also distort the duty cycle of an output clock signal or other periodically transmitted control signal, e.g., a strobe signal or an enable signal. RFMM may be caused by inherent process variations and may be exacerbated by changes in operating temperature. RAM transmitter 106 may adjust the duty cycle or propagation delay of pull-up transmitter 114 and/or pull-down transmitter 116 with delay codes received on delay code terminal 120a.

Pull-up transmitter 114 and pull-down transmitter 116 may be programmed with delay codes using various techniques. According to one embodiment, RFMM is reduced by programming pull-up transmitter 114 with a delay code while pull-down transmitter 116 remains unprogrammed. According to embodiments, RFMM is reduced by programming pull-down transmitter 116 with a delay code while pull-up transmitter 114 remains unprogrammed. According to embodiments, RFMM is reduced by programming pull-up transmitter 114 with a delay code first and programming pull-down transmitter 116 with another delay code second, or vice-versa.

Logic processor 110 may be configured to selectively activate TCO compensation circuit 112. According to embodiments, logic processor 110 may selectively apply a pulse to TCO compensation circuit 112 to cause TCO compensation circuit 112 to generate a TCO output on an output terminal 113. The applied pulse may also cause TCO compensation circuit 112 to generate delay codes which may be coupled to delay code terminals 120 to adjust or reduce the RFMM of RAM transmitters 106. TCO compensation circuit 112 may output the delay codes on delay code bus 115. Logic processor 110 may be configured to receive the TCO output and/or the delay codes from TCO compensation circuit 112 in response to the pulse selectively applied by logic processor 110. Logic processor 110 may use the generated TCO output and/or the generated delay codes to selectively and/or periodically update propagation delays of RAM transmitters 106 to reduce RFMM.

According to various embodiments, logic processor 110 or another control circuit within memory controller 102 may be configured to activate TCO compensation circuit 112 as part of a power-on sequence of memory controller 102 in order to calibrate RAM transmitters 106. According to other embodiments, logic processor 110 or another control circuit within memory controller 102 may be configured to periodically activate TCO compensation circuit 112 during operation of memory controller 102 to recalibrate RAM transmitters 106 in response to operating voltage and temperature changes of memory controller 102. Calibrating RAM transmitters 106 may include causing TCO compensation circuit 112 to generate TCO outputs and to generate delay codes with which to program RAM transmitters 106, e.g., pull-up transmitter 114 and/or pull-down transmitter 116.

As discussed above, TCO compensation circuit 112 may be configured to generate delay codes, i.e., TCO feedback codes, which are usable by memory controller 102 for calibration of RAM transmitters 106 to compensate for RFMM. TCO compensation circuit 112 may include output terminal 113, delay code bus 115, a digital input terminal 122, a RAM transmitter 124, a TCO comparator circuit 126, and a feedback circuit 128.

RAM transmitter 124 may include features similar to RAM transmitters 106 and be configured to enable TCO compensation code (i.e., delay code) generation rather than be coupled to one of terminals 108. According to embodiments, RAM transmitter 124 includes a pull-up transmitter 130 and a pull-down transmitter 132. Each of pull-up transmitter 130 and pull-down transmitter 132 may be coupled to digital input terminal 122 and may be coupled to receive delay codes from feedback circuit 128. According to embodiments, delay code bus 115 that couples feedback circuit 128 to RAM transmitter 124 may include 5 lines to provide 5-bit resolution delay codes.

TCO comparator circuit 126 may be configured to compare outputs from RAM transmitter 124 and to generate the TCO output in response to the comparison. According to embodiments, TCO comparator 126 may include multiple comparator paths to reduce errors introduced by circuitry of TCO comparator 126. TCO comparator 126 may employ digital circuits and exclude analog comparators to resolve delay codes quickly. According to embodiments, each delay code may represent approximately 4-8 picoseconds of delay.

Advantageously, TCO compensation circuit 112 may provide low-error TCO delay codes to enable memory controller 102 to transmit synchronous signals to memory 104 with a 50% duty cycle, i.e., an approximately zero value for RFMM.

According to embodiments, memory controller 102 may be integrated into a computer processor and memory 104 may be cache located within the computer processor. Logic processor 110 may include one or more logic circuits of the computer processor or may be independent of the non-memory controller logic. According to other embodiments, memory controller 102 may be integrated into an input/output (I/O) controller chipset. According to embodiments, memory 104 may be a RAM module configured as main memory of a computing system.

Figure 2:
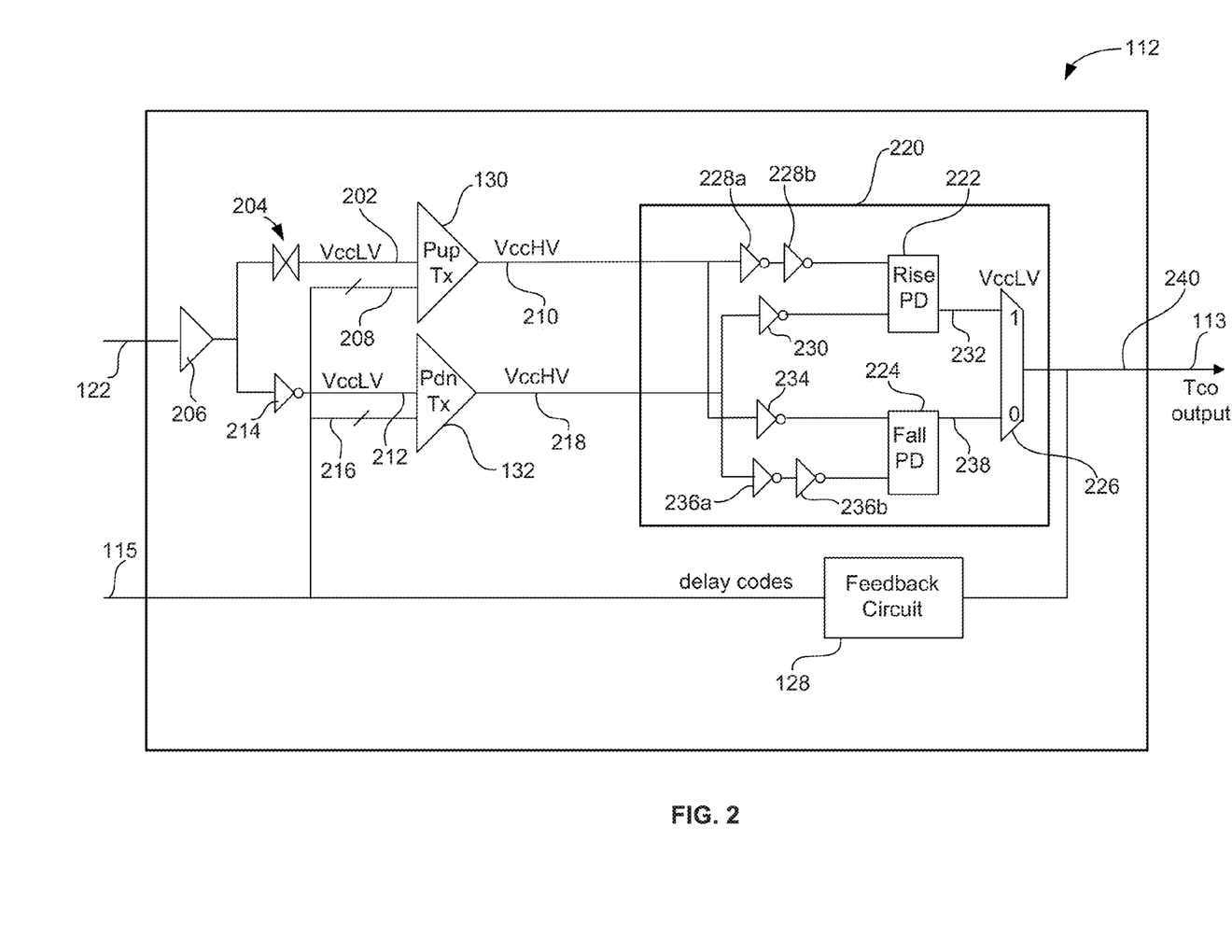
FIG. 2 describes a block diagram of a clock-to-output (TCO) compensation circuit of the memory controller FIG. 1, according to various embodiments of the present disclosure.

FIG. 2 illustrates an example of TCO compensation circuit 112, according to various embodiments of the disclosure.

As illustrated, pull-up transmitter 130 and pull-down transmitter 132 may be configured to be concurrently activated by a single input signal in order to determine and reduce RFMM. For example, pull-up transmitter 130 may have a data input terminal 202 coupled to digital input terminal 122. Data input terminal 202 may be coupled to digital input terminal 122 through a pass gate 204 and through a buffer 206. Pull-up transmitter 130 may also include a delay code input terminal 208 to receive delay codes from feedback circuit 128. Thus, pull-up transmitter 130 may be configured to transmit a rising-edge output signal on output terminal 210 in response to a rising-edge signal on digital input terminal 122 and based on delay codes received at delay code input terminal 208.

Pull-down transmitter 132 may be configured to transmit a falling-edge output signal in response to a rising-edge signal on digital input terminal 122. Pull-down transmitter 132 may have a data input terminal 212 coupled to digital input terminal 122 through an inverter 214 through buffer 206. Pull-down transmitter 132 may also include a delay code input terminal 216 to receive a delay codes from feedback circuit 128. Thus, pull-down transmitter 132 may be configured to transmit a falling-edge output signal on output terminal 218 in response to a rising-edge signal on digital input terminal 122 and based on delay codes received at delay code input terminal 216.

According to embodiments, pull-up transmitter 130 and pull-down transmitter 132 may be configured to level-shift voltage levels from a lower supply voltage VccLV (e.g., a supply voltage of a processor) to a higher supply voltage VccHV (e.g., a supply voltage of a dynamic RAM (DRAM) module). According to embodiments, lower supply voltage VccLV may be 1 volt and higher supply voltage VccHV may be 1.5 volts.

In operation, a low-to-high voltage transition is applied to digital input terminal 122. In response, pull-up transmitter 130 may output a rising-edge output signal on output terminal 210, and pull-down transmitter 132 may output a falling-edge output signal on output terminal 218. One of three conditions may result. First, a leading rising edge may occur if pull-up transmitter 130 transmits the rising-edge output signal on output terminal 210 before pull-down transmitter 132 transmits a falling-edge output signal on output terminal 218.

Second, zero RFMM may occur if pull-up transmitter 130 transmits the rising-edge output signal on output terminal 210 at approximately the same time that pull-down transmitter 132 transmits a falling-edge output signal on output terminal 218. Third, a leading falling-edge may occur if pull-up transmitter 130 transmits the rising-edge output signal on output terminal 210 after pull-down transmitter 132 transmits a falling-edge output signal on output terminal 218.

TCO comparator circuit 220 may be a specific implementation of TCO comparator circuit 126, according to embodiments. TCO comparator may be configured to determine whether the pull-up transmitter 130 transmission is leading or lagging the transmission of the pull-down transmitter 132. TCO comparator circuit 220 may include a rise phase detector 222, a fall phase detector 224, and a multiplexer 226.

Rise phase detector 222 may be a comparator configured to compare a delay between rising-edge signals from the pull-up transmitter 130 and pull-down transmitter 132. Inverters 228a and 228b may be positioned between rise phase detector 222 and output terminal 210. Inverter 230 may be positioned between rise phase detector 222 and output terminal 218 to invert the output of pull-down transmitter 132.

If the output from pull-up transmitter 130 leads, i.e., is detected before, the output from pull-down transmitter 132, rise phase detector 222 may provide a logic 1, i.e., a relatively high voltage, at output terminal 232. Rise phase detector 222 may provide a logic 0 at output terminal 232 if the output from pull-up transmitter 130 lags the output from pull-down transmitter 132.

Fall phase detector 224 may be a comparator configured to compare a delay between falling-edge signals from pull-up transmitter 130 and pull-down transmitter 132. Inverter 234 may be positioned between fall phase detector 224 and output terminal 210 to invert the output of pull-up transmitter 130. Inverters 236a and 236b may be positioned between fall phase detector 224 and output terminal 218.

If the output from pull-down transmitter 132 leads, i.e., is detected before, the output from pull-up transmitter 130, fall phase detector 224 may provide a logic 0, i.e., a relatively low voltage, at output terminal 238. Fall phase detector 224 may provide a logic 1 at output terminal 238 if the output from pull-down transmitter 132 lags the output from pull-up transmitter 130.

Multiplexer 226 selectively couples either output terminal 232 or output terminal 238 to TCO output terminal 240 and to feedback circuit 128. Multiplexer 226 may be configured to couple rise phase detector 222 to feedback circuit 128 until a first delay code is determined by TCO compensation circuit 112. Multiplexer 226 may be configured to level-shift voltages from a higher supply voltage VccHV to a lower supply voltage VccLV.

Feedback circuit 128 may be configured to increase and decrease delay codes based on the TCO output. For example, if feedback circuit 128 receives a logic 1, feedback circuit 128 may output a digital delay code that is one less than the previously output code. If feedback circuit 128 receives a logic 0, feedback circuit 128 may output a digital delay code that is one count higher than the previously output code. According to embodiments, feedback circuit may be a finite state machine. If, for example, delay code bus 115 is a 5 bit bus, feedback circuit 128 may initially determine the delay code to be 31. Feedback circuit may decrement the delay code for each logic 1 received from multiplexer 240 and may increment the delay code for each logic 0 received from multiplexer 240. TCO compensation circuit 112 may determine that a code is locked if the TCO output begins to toggle between logic 1 and logic 0 after subsequent feedback loops.

According to various embodiments, feedback circuit 128 may be a finite state machine having independent control over a delay code for the pull-up transmitter 130 and a delay code for the pull-down transmitter 132.

Advantageously, TCO comparator circuit 220 may couple rise phase detector 222 to output terminal 210 without intermediary components except two inverters, inverters 228a, 228b. TCO comparator may couple rise phase detector 222 to output terminal 218 without intermediary components other than one inverter, inverter 230. TCO comparator circuit 220 may couple fall phase detector 224 to output terminal 210 without intermediary components except one inverter, inverter 234. TCO comparator may couple fall phase detector 224 to output terminal 218 without intermediary components other than two inverters, inverters 236a, 236b. Some or all of inverters 228a, 228b, 230, 234, 236a, and 236b may have trip-points that are approximately set at ½ the supply voltage, i.e., VccHV, to align the rise delays and fall delays to a mid-voltage reference.

A result of determining delay codes with TCO compensation circuit 112 may be that an inherent duty-cycle error of RAM transmitters 106 and 124 may be replaced by an overall error of the compensation loop of TCO compensation circuit 112, i.e., a residual error. According to embodiments, the overall error of the compensation loop of TCO compensation circuit 112 may be less than half of the inherent duty-cycle error of RAM transmitters 106 and 124.

Figure 3:
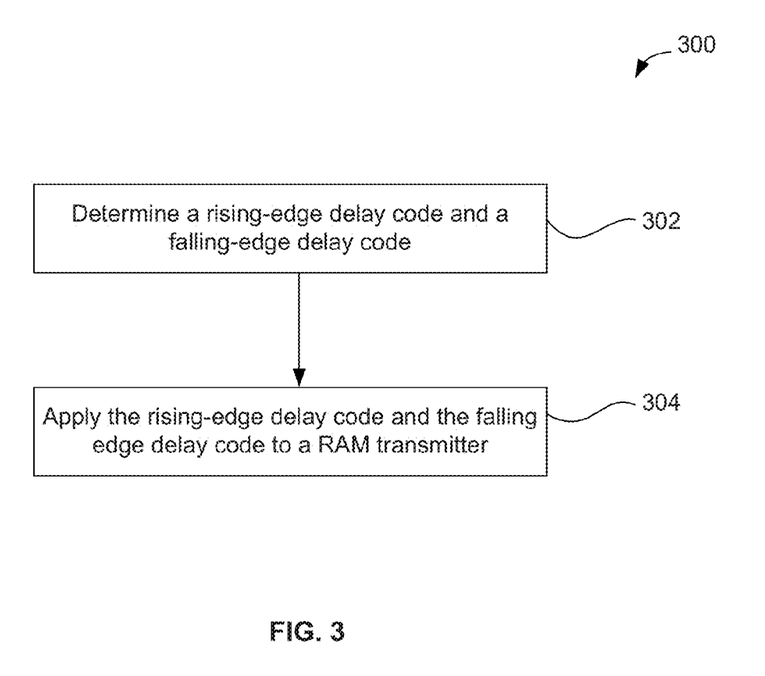
FIG. 3 describes a flow chart of an operation of the memory controller of FIG. 1, according to various embodiments of the present disclosure.

FIG. 3 illustrates an embodiment of a method 300 of operating TCO compensation circuit 112.

At block 302, TCO compensation circuit 112 may determine a first pair of rising-edge and falling edge TCO delay codes through a first comparator circuit, e.g., rise phase detector 222. A pulse may be received at digital input terminal 122. In response to the pulse, TCO comparator circuit 220 may generate a TCO output. Feedback circuit 128 may update the delay code for pull-up transmitter 130 or the pull-down transmitter 132 depending on the TCO output. Repeated pulses may be applied to provide subsequent delay codes to pull-up transmitter 130 or the pull-down transmitter 132 until feedback circuit 128 begins toggling back and forth between a 1 and a 0 to indicate delay code lock. In other words, feedback circuit 128 changes the delay codes to the pull-up transmitter 130 and pull-down transmitter 132 until the RFMM is approximately zero.

TCO compensation circuit 112 may then determine a second pair of rising-edge and falling-edge TCO delay code through a second comparator circuit, e.g., fall phase detector 224 in a like manner. TCO compensation circuit 112 may be configured to average the first and second rising-edge TCO delay codes, and first and second falling-edge TCO delay code to determine the final pair of rising and falling edge TCO delay codes for application to other transmitter circuits.

By determining the rising-edge TCO delay code and the falling-edge TCO delay code through both a first comparator circuit and a second comparator circuit, e.g., rise and fall phase detectors 222 and 224, TCO compensation circuit 112 may provide delay codes that have been averaged to reduce the influence of the electronic components of TCO comparator circuit 220 on the determination of the delay code.

At block 304, the rising-edge delay code and the falling-edge delay code may be applied to other RAM transmitters, e.g., RAM transmitters 106, located in a memory controller to reduce RFMM of the other RAM transmitters. According to one embodiment, an averaged rising-edge delay code and an averaged the falling-edge delay code is provided to RAM transmitters 106 to calibrate RAM transmitters 106 for operation.

Figure 4:
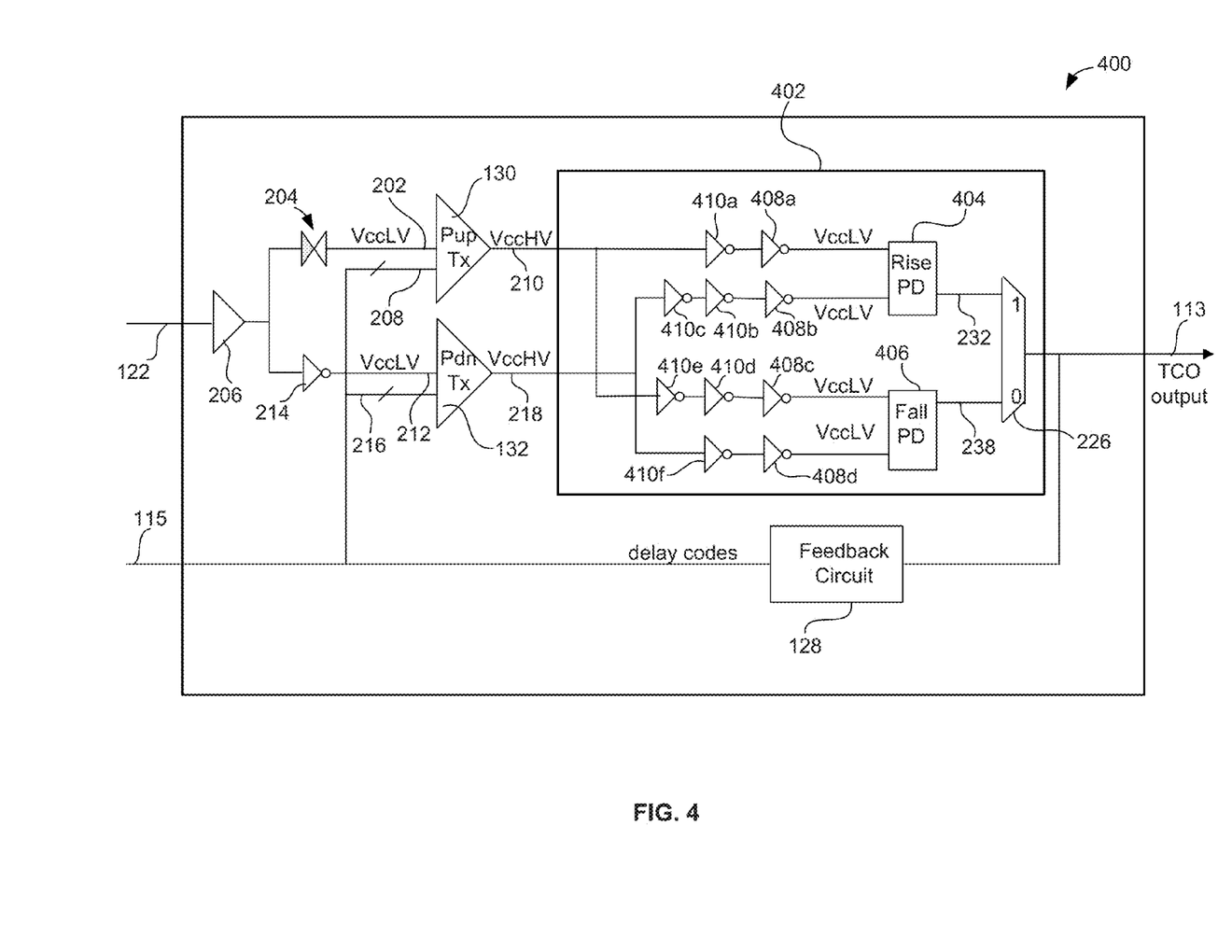
FIG. 4 describes a block diagram of a TCO compensation circuit of the memory controller FIG. 1, according to another embodiment of the present disclosure.

FIG. 4 illustrates TCO compensation circuit 400, which may be an implementation of TCO compensation circuit 112 according to various embodiments of the disclosure. TCO compensation circuit 400 includes a TCO comparator circuit 402. TCO comparator circuit 402 may be configured to reduce error in the RFMM compensation loop of TCO compensation circuit 400. TCO comparator circuit 402 may include a rise phase detector 404 fabricated with thin gate devices and a fall phase detector 406 fabricated with thin gate transistors. The thin gate phase detectors 404 and 406 may enable lower slew rate operation than gate phase detectors 222 and 224, which may be fabricated with thick gate transistors.

TCO comparator circuit 402 may include level-shifting inverters 408a, 408b, 408c, and 408d (collectively, 408). Level-shifting inverters 408 may be configured to level-shift voltages from a higher supply voltage VccHV to a lower supply voltage VccLV to enable the use of thin-gate phase detectors 404 and 406 to decrease signal propagation delays caused by TCO comparator circuit 402. Thin-gate phase detectors 404 and 406 may enable a reduction of dead-band error, i.e., an error that is small than the time resolution of each delay code (e.g., 4-8 picoseconds).

TCO comparator circuit 402 may include additional inverters 410a, 410b, 410c, 410d, 410e, and 410f (collectively, 410) coupled between phase detectors 404 and 406 and transmitters 130 and 132 to condition the output signals from transmitters 130 and 132 prior to comparison.

TCO compensation circuit may be configured to determine a delay code through the rise phase detector 404 and through the fall phase detector 406 to average out some of the error that may exist in the generated delay codes. In particular, TCO compensation circuit 400 or memory controller 102 may be configured to average the delay code generated through rise phase detector 404 with the delay code generated through fall phase detector 406. The average of the delay codes may be programmed into RAM transmitters 106 to reduce RFMM that may exist during operation of RAM transmitters 106.

While the embodiments of FIGS. 1-4 have been described with respect to RAM transmitters, according to various embodiments, the methods and apparatuses of the disclosed embodiments may be applied to industry standard RAM types such as double data rate synchronous dynamic RAM (DDR), DDR3, low-voltage DDR3 (DDR3L), ultra low-voltage DDR3 (DDR3U), DDR4, low power DDR2 (LPDDR2), LPDDR3, LPDDR4, and the like with data rates higher than 1066 million transfers per second (MTS).

According to various embodiments, the duty cycle compensation described in FIGS. 1-4 may be extended to input/output (IO) interfaces other than RAM transmitters. For example, the described duty cycle compensation methods may be extended to IO interfaces like general purpose IO (GPIO), the front-side bus (FSB), Wide IO, Fast Wide IO, which may each be configured to use transmitter circuits operating at data rates higher than 1066 MTS or frequencies higher than 1 GHz.

Implementation of various embodiments of the present disclosure may provide advantages that may be realized during testing. According to various embodiments, TCO compensation circuits 112 and 400 may be tested with four error buckets, such as error buckets A-D, as shown and described in Table 1.

TABLE 1

| Error bucket # | Error bucket name | Explanation (in terms of reference number or description) |
| --- | --- | --- |
| A | input pginv mm | Rise-Fall mismatch between 204 & 214 |
| B | tx mm | Rise-Fall mismatch between PUP Tx & PDN Tx |
| C | output INV-Buffer MM | Rise-Fall mismatch between 228a/b & 230; Rise-Fall mismatch between 236a/b & 234; Rise-Fall mismatch between 410a/408a & 408b/410b/410c; or Rise-Fall mismatch between 408c/410d/410e & 408d/410f |
| D | PD dead-band | Dead band of the phase detector 222, 224, 404, or 406 |

The compensation errors attributable to components of TCO compensation circuits 112 and 400 may include delay mismatches associated with error buckets A+C+D. The delay mismatches associated with error buckets A+C+D may be less than the delay mismatches associated with error buckets used to test TCO compensation circuits implemented using existing techniques. The embodiments of the present disclosure may advantageously be evaluated with less production testing and may contribute less error to the TCO compensation circuitry.

During simulation, embodiments of the present disclosure may have an overall lower mismatch than existing techniques for TCO compensation. Table 2 shows an example of a post-layout simulation of TCO compensation circuit 112 compared with existing techniques applied to DDR3. The skew column of Table 2-5 may correspond with various process variations that may produce typical transistor speeds, slow transistor speeds, and/or fast transistor speeds. The process variations may correspond to variations in threshold voltage of transistors, mismatches between n-type transistors and p-type transistors, and variations in doping. The Tx mm column may correspond to rise-fall mismatch (RFMM) measured in picoseconds (ps). The rise and fall TCO codes may each have a valid range of 32 codes (0-31) with a higher the code corresponding to a lower delay. The inherent error in the transmitter may be shown in the TCO Comp Off case where both of rise and fall TCO codes are fixed at the maximum code of 31.

TABLE 2

| | | | | | TCO Comp with existing Techniques | | | TCO Comp with TCO Comp circuit 112 | | | TCO Comp OFF | | |
|---|---|---|---|---|---|---|---|---|---|---|---|---|---|
| DDR Type | Skew | Temp (° C.) | VccLV (V) | VccHV (V) | Locked Rise Code | Locked Fall Code | Tx mm (ps) | Locked Rise Code | Locked Fall Code | Tx mm (ps) | Rise Code | Fall Code | Tx mm (ps) |
| DDR3 | rfff | −40 | 1.03 | 1.575 | 13 | 31 | −1.30 | 19 | 28 | −3.15 | 31 | 31 | −16.55 |
| 1333 MTS, | rfsf | 110 | 1.03 | 1.575 | 10 | 31 | 0.63 | 19 | 27 | −8.29 | 31 | 31 | −24.02 |
| Ron = 26 Ω, | rssf | −40 | 0.9 | 1.38 | 4 | 31 | 34.63 | 19 | 28 | −9.44 | 31 | 31 | −34.57 |
| SR = 4 V/ns | rsss | 110 | 0.9 | 1.38 | 10 | 31 | −0.85 | 18 | 29 | −11.36 | 31 | 31 | −43.68 |
| | rsss | −40 | 0.9 | 1.38 | 8 | 31 | 18.07 | 19 | 27 | −7.58 | 31 | 31 | −34.16 |
| | tttt | 50 | 1.0 | 1.5 | 14 | 31 | −5.53 | 19 | 27 | −7.02 | 31 | 31 | −24.66 |

The worst case RFMM may be less than 11.36 ps using TCO compensation circuit 112 while with existing techniques of compensation the worst case RFMM may be 34.63 ps. Additionally, the worst cast RFMM inherent in a transmitter, i.e., TCO Comp OFF, may be 43.68 ps. The proposed scheme may provide more than twice the performance benefit over existing techniques, bringing the duty-cycle to within 0.8% of the 50% duty cycle.

Table 3 shows an example of a post-layout simulation of TCO compensation circuit 112 applied to DDR3L and DDR3U.

TABLE 3

| | | | | | TCO Comp with TCO Comp circuit 112 | | | TCO Comp OFF | | |
|---|---|---|---|---|---|---|---|---|---|---|
| | | | | | Locked | | | | | |
| DDR Type | Skew | Temp (° C.) | VccLV (V) | VccHV (V) | Rise Code | Locked Fall Code | Tx mm (ps) | Rise Code | Fall Code | Tx mm (ps) |
| DDR3L | rfff | −40 | 1.03 | 1.42 | 19 | 26 | −2.77 | 31 | 31 | −14.97 |
| 1066 MTS, | rfsf | 110 | 1.03 | 1.42 | 19 | 27 | −7.85 | 31 | 31 | −23.60 |
| Ron = 26 Ω, | rssf | −40 | 0.9 | 1.23 | 18 | 27 | −4.08 | 31 | 31 | −30.26 |
| SR = 4 V/ns | rsss | 110 | 0.9 | 1.23 | 18 | 25 | −12.12 | 31 | 31 | −39.94 |
| | rsss | −40 | 0.9 | 1.23 | 18 | 26 | −3.22 | 31 | 31 | −32.07 |
| | tttt | 50 | 1.0 | 1.35 | 18 | 25 | −5.30 | 31 | 31 | −23.36 |
| DDR3U | rfff | −40 | 1.03 | 1.32 | 19 | 25 | −2.60 | 31 | 31 | −14.29 |
| 800 MTS, | rfsf | 110 | 1.03 | 1.32 | 19 | 25 | −7.13 | 31 | 31 | −21.48 |
| Ron = 40 Ω, | rssf | −40 | 0.9 | 1.125 | 18 | 24 | 0.31 | 31 | 31 | −23.65 |
| SR = 2.8 V/ns | rsss | 110 | 0.9 | 1.125 | 17 | 24 | −6.05 | 31 | 31 | −37.13 |
| | rsss | −40 | 0.9 | 1.125 | 18 | 24 | 1.45 | 31 | 31 | −26.01 |
| | tttt | 50 | 1.0 | 1.25 | 18 | 24 | −5.44 | 31 | 31 | −23.11 |

The worst case RFMM may be less than 12.12 ps using TCO compensation circuit 112, while the inherent Tx mm may be 39.94 ps. The proposed scheme may provide more than twice the performance benefit over TCO Comp OFF case, bringing the duty-cycle to within 0.7% of the 50% duty cycle.

Table 4 shows an example of a post-layout simulation of TCO compensation circuit 400 applied to DDR3, DDR3L and DDR3U, according to embodiments.

TABLE 4

| | | | | | TCO Comp with TCO Comp circuit 400 | | | TCO Comp OFF | | |
|---|---|---|---|---|---|---|---|---|---|---|
| DDR Type | Skew | Temp (° C.) | VccLV (V) | VccHV (V) | Locked Rise Code | Locked Fall Code | TX mm (ps) | Rise Code | Fall Code | Tx mm (ps) |
| DDR3 | rfff | −40 | 1.03 | 1.575 | 23 | 27 | −14.45 | 31 | 31 | −16.94 |
| 1866 MTS, | rfsf | 110 | 1.03 | 1.575 | 24 | 30 | −20.78 | 31 | 31 | −25.22 |
| Ron = 26 Ω, | rsss | 110 | 0.9 | 1.35 | 14 | 31 | −10.01 | 31 | 31 | −40.98 |
| SR = 4 V/ns | rsss | −40 | 0.9 | 1.35 | 19 | 31 | −15.74 | 31 | 31 | −33.63 |
| | tttt | 50 | 1.0 | 1.5 | 23 | 31 | −15.89 | 31 | 31 | −22.91 |
| DDR3L | rfff | −40 | 1.03 | 1.42 | 23 | 28 | −12.20 | 31 | 31 | −14.86 |
| 1333 MTS, | rfsf | 110 | 1.03 | 1.42 | 23 | 31 | −16.36 | 31 | 31 | −22.87 |
| Ron = 26 Ω, | rsss | 110 | 0.9 | 1.23 | 17 | 31 | −15.62 | 31 | 31 | −38.04 |
| SR = 4 V/ns | rsss | −40 | 0.9 | 1.23 | 22 | 31 | −16.55 | 31 | 31 | −28.52 |
| | tttt | 50 | 1.0 | 1.35 | 23 | 31 | −15.57 | 31 | 31 | −22.63 |

TABLE 4-continued

| | | | | | TCO Comp with TCO Comp circuit 400 | | | TCO Comp OFF | | |
|---|---|---|---|---|---|---|---|---|---|---|
| DDR Type | Skew | Temp (° C.) | VccLV (V) | VccHV (V) | Locked Rise Code | Locked Fall Code | TX mm (ps) | Rise Code | Fall Code | Tx mm (ps) |
| DDR3U | rfff | −40 | 1.03 | 1.32 | 21 | 25 | −10.38 | 31 | 31 | −13.34 |
| 1066 MTS, | rfsf | 110 | 1.03 | 1.32 | 22 | 26 | −20.23 | 31 | 31 | −23.50 |
| Ron = 40 Ω, | rsss | 110 | 0.9 | 1.125 | 16 | 31 | −9.85 | 31 | 31 | −34.26 |
| SR = 2.8 V/ns | rsss | −40 | 0.9 | 1.125 | 21 | 31 | −7.67 | 31 | 31 | −21.55 |
| | tttt | 50 | 1.0 | 1.25 | 19 | 31 | −8.80 | 31 | 31 | −20.29 |

The worst case RFMM may be less than 20.78 ps with TCO compensation circuit 400, while the worst case inherent Tx mm may be 41 ps. The proposed scheme may provide more than twice the performance benefit over the TCO Comp OFF case, bringing the duty-cycle to within 1.94% of the 50% duty cycle for DDR3, and 1.1% of the 50% duty cycle for DDR3L and DDR3U.

Table 5 shows an example of a post-layout simulation of TCO compensation circuit 400 applied to LPDDR at 1066 MTS and 1600 MTS, according to embodiments.

TABLE 5

| | | | | | TCO Comp with TCO Comp circuit 400 | | | TCO Comp OFF | | |
|---|---|---|---|---|---|---|---|---|---|---|
| DDR Type | Skew | Temp (° C.) | VccLV (V) | VccHV (V) | Locked Rise Code | Locked Fall Code | TX mm (ps) | Rise Code | Fall Code | Tx mm (ps) |
| LPDDR | rfff | −3 | 1.03 | 1.26 | 21 | 25 | −10.34 | 31 | 31 | −12.20 |
| 1066 MTS, | rfsf | 110 | 1.03 | 1.26 | 22 | 26 | −18.89 | 31 | 31 | −22.21 |
| Ron = 40 Ω, | rsss | 110 | 0.9 | 1.08 | 12 | 31 | −0.10 | 31 | 31 | −36.35 |
| SR = 2 V/ns | rsss | −3 | 0.9 | 1.08 | 18 | 31 | −2.94 | 31 | 31 | −22.65 |
| | tttt | 50 | 1.0 | 1.2 | 22 | 31 | −13.14 | 31 | 31 | −21.04 |
| LPDDR | rfff | −3 | 1.03 | 1.26 | 22 | 25 | −11.44 | 31 | 31 | −13.13 |
| 1600 MTS, | rfsf | 110 | 1.03 | 1.26 | 23 | 27 | −19.14 | 31 | 31 | −22.29 |
| Ron = 40 Ω, | rsss | 110 | 0.9 | 1.08 | 13 | 31 | 2.94 | 31 | 31 | −38.23 |
| SR = 2 V/ns | rsss | −3 | 0.9 | 1.08 | 16 | 31 | 4.34 | 31 | 31 | −23.94 |
| | tttt | 50 | 1.0 | 1.2 | 22 | 31 | −11.86 | 31 | 31 | −19.82 |

The worst case RFMM may be less than 19.14 ps with TCO compensation circuit 400, while the worst case inherent Tx mm, i.e., TCO Comp OFF, may be 38.23 ps. TCO compensation circuit 400 may provide more than twice the performance benefit of TCO Comp OFF case, bringing the duty-cycle to within 1% of the 50% duty cycle for LPDDR 1066, and 1.5% of the 50% duty cycle for LPDDR 1600.

Figure 5:
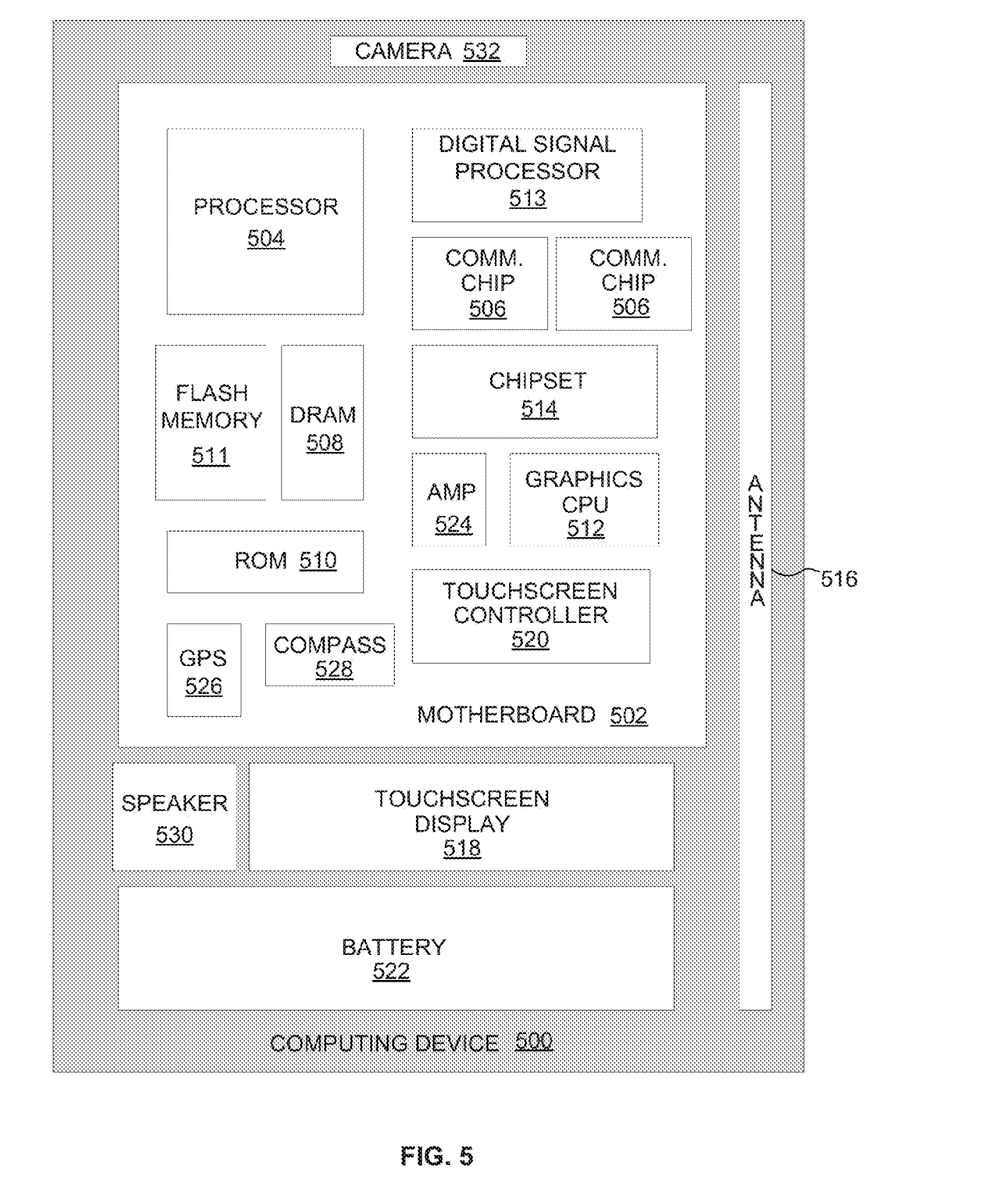
FIG. 5 describes a block diagram of an implementation of the memory controller of FIG. 1, according to various embodiments of the present disclosure.

FIG. 5 illustrates a computing device 500 in accordance with one implementation of an embodiment of the invention. The computing device 500 houses a board 502. The board 502 may include a number of components, including but not limited to a processor 504 and at least one communication chip 506. The processor 504 may be physically and electrically coupled to the board 502. In some implementations the at least one communication chip 506 may also be physically and electrically coupled to the board 502. In further implementations, the communication chip 506 may be part of the processor 504.

Depending on its applications, computing device 500 may include other components that may or may not be physically and electrically coupled to the board 502. These other components include, but are not limited to, volatile memory (e.g., DRAM 508), non-volatile memory (e.g., ROM 510), flash memory 511, a graphics processor 512, a digital signal processor 513, a crypto processor, a chipset 514, an antenna 516, a display, a touchscreen display 518, a touchscreen controller 520, a battery 522, an audio codec, a video codec, a power amplifier 524, a global positioning system (GPS) device 526, a compass 528, an accelerometer, a gyroscope, a speaker 530, a camera 532, and a mass storage device (such as hard disk drive, compact disk (CD), digital versatile disk (DVD), and so forth).

According to various embodiments, chipset 514 may include memory controller 102 and TCO compensation circuit 112 or 400. According to embodiments, DRAM 508 may be memory 104.

The communication chip 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the disclosure, the integrated circuit die of the processor includes one or more devices, such as memory controller 102 and TCO compensation circuit 112 or 400 operably configured according to embodiments of the disclosure. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506.

In further implementations, another component housed within the computing device 500 may contain an integrated circuit die that includes one or more devices, such as processor cores, cache and one or more memory controllers.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

According to various embodiments, an apparatus may include a digital input terminal and a pull-up transmitter coupled to the digital input terminal and configured to selectively delay a rising edge of a first output. The apparatus may include a pull-down transmitter coupled to the digital input terminal and configured to selectively delay a falling edge of a second output and a clock-to-output (TCO) compensation circuit coupled to the pull-up transmitter and the pull-down transmitter. The TCO compensation circuit may be configured to compare the first output with the second output and to generate a delay code, based on the comparison, for at least one random access memory (RAM) transmitter to adjust a duty cycle of a third output associated with the at least one other RAM transmitter. The pull-up transmitter may be configured to selectively delay the rising edge of the first output in response to the delay code and the pull-down transmitter may be configured to selectively delay the falling edge of the second output in response to the delay code. The TCO compensation circuit may include a comparator circuit and a feedback circuit. The comparator circuit may be configured to determine a rise-fall mismatch (RFMM) between the first output and the second output and to provide a TCO output associated with the RFMM. The feedback circuit may be configured to generate the delay code in response to the TCO output. The feedback circuit may be configured to decrease the delay code if the TCO output is logic-level HIGH and be configured to increase the delay code if the TCO output is logic-level LOW.

According to embodiments, the comparator circuit may include a rising edge phase detector coupled to the pull-up transmitter without intermediary circuitry between the rising edge phase detector and the pull-up transmitter other than a first inverter and a second inverter. The rising edge phase detector may be coupled to the pull-down transmitter without intermediary circuitry between the rising edge phase detector and the pull-down transmitter other than a third inverter. The comparator circuit may include a falling edge phase detector coupled to the pull-up transmitter without intermediary circuitry between the falling edge phase detector and the pull-up transmitter other than a fourth inverter. The falling edge phase detector may be coupled to the pull-down transmitter without intermediary circuitry between the falling edge phase detector and the pull-down transmitter other than a fifth inverter and a sixth inverter. The comparator circuit may include a first comparator circuit to compare the first output to the second output and a second comparator circuit to compare the first output to the second output. The compensation circuit may be configured to use the first comparator circuit and the second comparator circuit to reduce an error in the determined RFMM.

According to various embodiments, a method may include determining a rising edge clock-to-output (TCO) delay code in a pull-up transmitter, disposed on a die, based on a first output of a first comparator circuit of a TCO compensation circuit, based on a second output of a second comparator circuit of the TCO compensation circuit, or based on a combination of the first output and the second output. The method may include determining a falling edge TCO delay code in a pull-down transmitter, disposed on the die, through a third output of the first comparator circuit, based on a fourth output of the second comparator circuit, or based on a combination of the third output and the fourth output. The method may include applying the rising edge TCO delay code and the falling edge TCO delay code to at least one other transmitter that is located on the die in order to control rise-fall mismatch (RFMM) of an output of the at least one other transmitter.

According to embodiments, determining the rising edge TCO delay code based on a combination of the first output and the second output may include determining a first delay code based on the first output; determining a second delay code based on the second output; and determining the rising edge TCO delay code by averaging the first delay code with the second delay code to compensate for propagation delay mismatches of components of the TCO compensation circuit.

According to embodiments, determining the falling edge TCO delay code based on a combination of the third output and the fourth output may include determining a third delay code based on the third output; determining a fourth delay code based on the fourth output; and determining the falling edge TCO delay code by averaging the third delay code with the fourth delay code to compensate for propagation delay mismatches of components of the TCO compensation circuit.

According to embodiments, applying may include periodically determining the rising edge TCO delay code; periodically determining the falling edge TCO delay code; and periodically applying the rising edge TCO delay code and the falling edge TCO delay code to the at least one other transmitter during operation of circuits on the die to compensate for operational voltage and temperature changes.

According to embodiments, determining the rising edge TCO delay code in the pull-up transmitter may include providing a rising edge output by the pull-up transmitter in response to a clock pulse and after a duration of the rising edge TCO delay code and providing a falling edge output by the pull-up transmitter in response to the clock pulse and after a duration of the falling edge TCO delay code. Determining the rising edge TCO delay code in the pull-up transmitter may include comparing, with the first comparator and/or the second comparator configured as at least one phase detector, the rising edge output to the falling edge output and if the rising edge output leads the falling edge output, adjusting the rising edge TCO delay code through a feedback circuit. Determining the rising edge TCO delay code in the pull-up transmitter may include, if the falling edge output leads the rising edge output, adjusting the falling edge TCO code delay through the feedback circuit.

According to various embodiments, a memory controller may include a number of random access memory (RAM) transmitters operable to drive RAM; and a clock-to-output (TCO) compensation circuit configured to determine a rising edge TCO delay code and a falling edge TCO delay code for the number of RAM transmitters. The TCO compensation circuit may include a pull-up transmitter coupled to a digital input terminal and configured to selectively delay a rising edge of a first output and a pull-down transmitter coupled to the digital input terminal and configured to selectively delay a falling edge of a second output. The TCO compensation circuit may include a TCO comparator circuit coupled to the pull-up transmitter and the pull-down transmitter. The TCO comparator circuit may be configured to compare the first output with the second output and to generate a delay code, based on the comparison, for the number of RAM transmitters to adjust duty cycles of a number of outputs corresponding to the number of RAM transmitters. The TCO compensation circuit may include a rising edge phase detector coupled to the pull-up transmitter without intermediary circuitry between the rising edge phase detector and the pull-up transmitter other than a first inverter and a second inverter. The rising edge phase detector may be coupled to the pull-down transmitter without intermediary circuitry between the rising edge phase detector and the pull-down transmitter other than a third inverter. The TCO compensation circuit may include a falling edge phase detector coupled to the pull-up transmitter without intermediary circuitry between the falling edge phase detector and the pull-up transmitter other than a fourth inverter. The falling edge phase detector may be coupled to the pull-down transmitter without intermediary circuitry between the falling edge phase detector and the pull-down transmitter other than a fifth inverter and a sixth inverter.

According to embodiments, the TCO compensation circuit may be configured to determine a rise-fall mismatch (RFMM) between the RAM pull-up transmitter and the pull-down transmitter and may include a first comparator circuit configured to compare the first output to the second output and a second comparator circuit configured to compare the first output to the second output. The TCO compensation circuit may be configured to average results from the first comparator circuit and the second comparator circuit to reduce an error in the determined RFMM. At least one of the number of RAM transmitters may be coupled to either a strobe terminal of the memory controller, a data terminal of the memory controller, or a RAM address line of the memory controller. The TCO compensation circuit may be configured to determine a RFMM between the pull-up transmitter and the pull-down transmitter through multiple comparator feedback loops to reduce error in the determined RFMM.

According to various embodiments, a system may include a processor, random access memory (RAM) operatively coupled to the processor, and a memory controller operatively coupled to the processor and the RAM. The memory controller may include a number of RAM transmitters operable to drive the RAM and a clock-to-output (TCO) compensation circuit configured to determine a rising edge TCO delay code and a falling edge TCO delay code for the number of RAM transmitters. The TCO compensation circuit may include a pull-up transmitter coupled to a digital input terminal and configured to selectively delay a rising edge of a first output and a pull-down transmitter coupled to the digital input terminal and configured to selectively delay a falling edge of a second output. The TCO compensation circuit may include a TCO comparator circuit coupled to the pull-up transmitter and the pull-down transmitter. The TCO comparator circuit may be configured to compare the first output with the second output and to generate a code, based on the comparison, for the number of RAM transmitters to adjust duty cycles of a number of outputs corresponding to the number of RAM transmitters. The system may include a communication interface operatively coupled with the processor to communicatively couple the system to a wireless network. The system may be a selected one of a laptop, a netbook, a notebook, an ultrabook, a smartphone, a tablet, a personal digital assistant, an ultra mobile PC, a mobile phone, a desktop computer, a server, a printer, a scanner, a monitor, a set-top box, an entertainment control unit, a digital camera, a portable music player, or a digital video reorder. The system may include a display device operatively coupled with the processor. The display device may be a touch screen.

The above description of illustrated implementations of the disclosure, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Specific features of any of the above described embodiments may be fully or partially combined with one or more other embodiments, either wholly or partially, to form new embodiments of the disclosure.

What is claimed is:

1. An apparatus, comprising:
   a digital input terminal;
   a pull-up transmitter coupled to the digital input terminal and configured to selectively delay a rising edge of a first output;
   a pull-down transmitter coupled to the digital input terminal and configured to selectively delay a falling edge of a second output; and
   a clock-to-output (TCO) compensation circuit, coupled to the pull-up transmitter, the pull-down transmitter, and at least one random access memory (RAM) transmitter, to compare the first output with the second output and to generate a delay code, based on the comparison, for the at least one RAM transmitter to adjust a duty cycle of a third output associated with the at least one RAM transmitter,
   wherein to compare the first output with the second output, the TCO compensation circuit includes a rising edge phase detector to compare a delay between rising-edge signals from the pull-up transmitter and the pull-down transmitter.

2. The apparatus of claim 1, wherein the pull-up transmitter is configured to selectively delay the rising edge of the first output in response to the delay code and the pull-down transmitter is configured to selectively delay the falling edge of the second output in response to the delay code.

3. The apparatus of claim 1, wherein the TCO compensation circuit includes a comparator circuit and a feedback circuit, wherein the comparator circuit is configured to determine a rise-fall mismatch (RFMM) between the first output and the second output and to provide a TCO output associated with the RFMM.

4. The apparatus of claim 3, wherein the feedback circuit is configured to generate the delay code in response to the TCO output.

5. The apparatus of claim 4, wherein the feedback circuit is configured to decrease the delay code if the TCO output is logic-level HIGH and configured to increase the delay code if the TCO output is logic-level LOW.

6. The apparatus of claim 3, wherein the rising edge phase detector is coupled to the pull-up transmitter without intermediary circuitry between the rising edge phase detector and the pull-up transmitter other than a first inverter and a second inverter, wherein the rising edge phase detector is coupled to the pull-down transmitter without intermediary circuitry between the rising edge phase detector and the pull-down transmitter other than a third inverter.

7. The apparatus of claim 6, wherein the comparator circuit includes a falling edge phase detector coupled to the pull-up transmitter without intermediary circuitry between the falling edge phase detector and the pull-up transmitter other than a fourth inverter, wherein the falling edge phase detector is coupled to the pull-down transmitter without intermediary circuitry between the falling edge phase detector and the pull-down transmitter other than a fifth inverter and a sixth inverter.

8. The apparatus of claim 3, wherein the comparator circuit includes a first comparator circuit to compare the first output to the second output and a second comparator circuit to compare the first output to the second output, wherein the compensation circuit is configured to use the first comparator circuit and the second comparator circuit to reduce an error in the determined RFMM.

9. A method, comprising:
  determining a rising edge clock-to-output (TCO) delay code in a pull-up transmitter, disposed on a die, based on a first output of a first comparator circuit of a TCO compensation circuit, based on a second output of a second comparator circuit of the TCO compensation circuit, or based on a combination of the first output and the second output, wherein determining the rising edge TCO delay code based on a combination of the first output and the second output includes:
    determining a first delay code based on the first output;
    determining a second delay code based on the second output; and
    determining the rising edge TCO delay code by averaging the first delay code with the second delay code to compensate for propagation delay mismatches of components of the TCO compensation circuit;
  determining a falling edge TCO delay code in a pull-down transmitter, disposed on the die, through a third output of the first comparator circuit, based on a fourth output of the second comparator circuit, or based on a combination of the third output and the fourth output; and
  applying the rising edge TCO delay code and the falling edge TCO delay code to at least one other transmitter that is located on the die to control rise-fall mismatch (RFMM) of an output of the at least one other transmitter.

10. The method of claim 9, wherein determining the falling edge TCO delay code based on a combination of the third output and the fourth output includes:
  determining a third delay code based on the third output;
  determining a fourth delay code based on the fourth output; and
  determining the falling edge TCO delay code by averaging the third delay code with the fourth delay code to compensate for propagation delay mismatches of components of the TCO compensation circuit.

11. The method of claim 9, wherein said applying includes:
  periodically determining the rising edge TCO delay code;
  periodically determining the falling edge TCO delay code; and
  periodically applying the rising edge TCO delay code and the falling edge TCO delay code to the at least one other transmitter during operation of circuits on the die to compensate for operational voltage and temperature changes.

12. The method of claim 9, wherein determining the rising edge TCO delay code in the pull-up transmitter includes:
  providing a rising edge output by the pull-up transmitter in response to a clock pulse and after a duration of the rising edge TCO delay code;
  providing a falling edge output by the pull-up transmitter in response to the clock pulse and after a duration of the falling edge TCO delay code;
  comparing, with the first comparator and/or the second comparator configured as at least one phase detector, the rising edge output to the falling edge output;
  if the rising edge output leads the falling edge output, adjusting the rising edge TCO delay code through a feedback circuit; and
  if the falling edge output leads the rising edge output, adjusting the falling edge TCO code delay through the feedback circuit.

13. A memory controller, comprising:
  a plurality of random access memory (RAM) transmitters operable to drive RAM; and
  a clock-to-output (TCO) compensation circuit configured to determine a rising edge TCO delay code and a falling edge TCO delay code for the plurality of RAM transmitters, the TCO compensation circuit including:
    a pull-up transmitter coupled to a digital input terminal and configured to selectively delay a rising edge of a first output;
    a pull-down transmitter coupled to the digital input terminal and configured to selectively delay a falling edge of a second output; and
    a TCO comparator circuit, coupled to the pull-up transmitter, the pull-down transmitter, and the plurality of RAM transmitters, to compare the first output with the second output and to generate a delay code, based on the comparison, for the plurality of RAM transmitters to adjust duty cycles of a plurality of outputs corresponding to the plurality of RAM transmitters,
    wherein to compare the first output with the second output, the TCO compensation circuit includes a rising edge phase detector to compare a delay between rising-edge signals from the pull-up transmitter and the pull-down transmitter.

14. The memory controller of claim 13, wherein the rising edge phase detector is coupled to the pull-up transmitter without intermediary circuitry between the rising edge phase detector and the pull-up transmitter other than a first inverter and a second inverter, wherein the rising edge phase detector is coupled to the pull-down transmitter without intermediary circuitry between the rising edge phase detector and the pull-down transmitter other than a third inverter.

15. The memory controller of claim 14, wherein the TCO compensation circuit includes a falling edge phase detector coupled to the pull-up transmitter without intermediary circuitry between the falling edge phase detector and the pull-up transmitter other than a fourth inverter, wherein the falling edge phase detector is coupled to the pull-down transmitter without intermediary circuitry between the falling edge phase detector and the pull-down transmitter other than a fifth inverter and a sixth inverter.

16. The memory controller of claim 13, wherein the TCO compensation circuit is configured to determine a rise-fall mismatch (RFMM) between the RAM pull-up transmitter and the pull-down transmitter and includes:
 a first comparator circuit configured to compare the first output to the second output; and
 a second comparator circuit configured to compare the first output to the second output.

17. The memory controller of claim 16, wherein the TCO compensation circuit is configured to average results from the first comparator circuit and the second comparator circuit to reduce an error in the determined RFMM.

18. The memory controller of claim 13, wherein at least one of the plurality of RAM transmitters is coupled to either a strobe terminal of the memory controller, a data terminal of the memory controller, or a RAM address line of the memory controller.

19. The memory controller of claim 13, wherein the TCO compensation circuit is configured to determine a RFMM between the pull-up transmitter and the pull-down transmitter through multiple comparator feedback loops to reduce error in the determined RFMM.

20. A system comprising:
 a processor;
 random access memory (RAM) operatively coupled to the processor;
 a memory controller operatively coupled to the processor and the RAM, the memory controller comprising:
  a plurality of RAM transmitters operable to drive the RAM; and
  a clock-to-output (TCO) compensation circuit configured to determine a rising edge TCO delay code and a falling edge TCO delay code for the plurality of RAM transmitters, the TCO compensation circuit including:
   a pull-up transmitter coupled to a digital input terminal and configured to selectively delay a rising edge of a first output;
   a pull-down transmitter coupled to the digital input terminal and configured to selectively delay a falling edge of a second output; and
   a TCO comparator circuit, coupled to the pull-up transmitter, the pull-down transmitter, and the plurality of RAM transmitters, to compare the first output with the second output and to generate a code, based on the comparison, for the plurality of RAM transmitters to adjust duty cycles of a plurality of outputs corresponding to the plurality of RAM transmitters, wherein to compare the first output with the second output, the TCO compensation circuit includes a rising edge phase detector to compare a delay between rising-edge signals from the pull-up transmitter and the pull-down transmitter; and
 a communication interface operatively coupled with the processor to communicatively couple the system to a wireless network.

21. The system of claim 20, wherein the system is a selected one of a laptop, a netbook, a notebook, an ultrabook, a smartphone, a tablet, a personal digital assistant, an ultra mobile PC, a mobile phone, a desktop computer, a server, a printer, a scanner, a monitor, a set-top box, an entertainment control unit, a digital camera, a portable music player, or a digital video reorder.

22. The system of claim 20, further comprising a display device operatively coupled with the processor.

23. The system of claim 22, wherein the display device is a touch screen.

* * * * *